(12) United States Patent
Stevens et al.

(10) Patent No.: US 6,351,001 B1
(45) Date of Patent: Feb. 26, 2002

(54) CCD IMAGE SENSOR

(75) Inventors: Eric G. Stevens; James P. Lavine; Charles V. Stancampiano, all of Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 713 days.

(21) Appl. No.: 08/633,598

(22) Filed: Apr. 17, 1996

(51) Int. Cl.[7] ............... H01L 27/148; H01L 29/768
(52) U.S. Cl. ........................... 257/223; 257/233
(58) Field of Search ........................... 257/223, 229, 257/230, 232, 233

(56) References Cited

U.S. PATENT DOCUMENTS

| | | | |
|---|---|---|---|
| 4,851,890 A | * 7/1989 | Miyatake | 257/223 |
| 5,014,132 A | 5/1991 | Kumesawa et al. | 358/213 |
| 5,191,399 A | * 3/1993 | Maegawa et al. | 257/223 |
| 5,404,039 A | * 4/1995 | Watanabe | 257/223 |
| 5,446,297 A | * 8/1995 | Lee | 257/223 |
| 5,514,887 A | * 5/1996 | Hokari | 257/223 |

* cited by examiner

*Primary Examiner*—Gene M. Munson
(74) *Attorney, Agent, or Firm*—Peyton C. Watkins

(57) ABSTRACT

A charge-coupled device (CCD) image sensor that preserves defect gettering characteristics having a vertical overflow drain (VOD) for blooming protection is provided in a structure that provides low voltage electronic shuttering. This structure reduces the electronic shutter voltage to ease the demands on off-chip support circuitry required to operate the CCD image sensor. The invention provides an improved pixel structure to reduce this voltage. Prior art difficulties are avoided by providing uniform, n-type layers of varying doping levels underneath the entire area of the CCD device. Combined with a lightly doped n-type substrate these layers provide low voltage electronic shutter operation.

10 Claims, 7 Drawing Sheets

CCD IMAGE SENSOR

FIELD OF INVENTION

This invention relates to a charge-coupled device (COD) image sensor with a vertical-overflow drain (VOD) for antiblooming protection, and more particularly, to low voltage electronic shuttering of solid-state CCD image sensors.

BACKGROUND OF THE INVENTION

Prior art structures for improving the electronic shuttering characteristics of image sensors provide confined regions of higher doping concentration directly beneath the individual detector elements of an interline (IL) CCD imager as shown in FIG. 4. This reduces the depletion spreading into the substrate thereby increasing capacitive coupling from the substrate to the so-called overflow point. This increased capacitive coupling allows the overflow barrier (potential difference between the storage region of the photodetector and the overflow point) to be pulled down more easily, i.e., with less voltage on the substrate.

However, processing is made difficult in the prior art by the fact that these regions are confined to the area directly under each individual detector. Implanting these n+ regions relatively late in the process (e.g., around the same time the photodiodes are formed) would require extremely high energy or a reduced p-well depth. A reduced p-well depth would reduce photosensitivity at longer wavelengths, and is therefore undesirable. The currently available high-energy implantation equipment is not capable of providing energies high enough for this approach. Another problem with high-energy implantation is maintaining purity of the beam which makes process control difficult. Implanting these regions early in the process and driving them also would be difficult since registration of various layers would be poor (i.e., self alignment would not be possible).

Prior art CCD image sensors of the type shown in FIG. 3, but not for type shown in FIG. 4, however, typically require relatively large substrate voltages (around 40 volts) to affect electronic shutter action.

The prior art sensor shown in FIG. 9 is illustrated similar as in U.S. Pat. No. 5,014,132.

This prior art device has improved voltage characteristics for electronic shutter operation which results from heavily doping the substrate 91 as compared to n-type layer 92. P-well 93 is provided within which imaging layers are created. However, the device in FIG. 9 does not result in desirable internal gettering characteristics because oxygen precipitation is more difficult to induce when the n-type dopant concentration is increased.

It can be seen from the foregoing discussion that their remains a need within the art for a device having improved low voltage characteristics for the electronic shutter that is built on a substrate that is easy to getter internally.

SUMMARY OF THE INVENTION

We have invented a structure that provides a reduction in the voltage required to operate electronic shutters while maintaining sufficiently easy gettering within the sensor. The resulting performance eases the demands on off-chip support circuitry required to operate this sensor. The present invention provides an improved pixel structure that allows for a reduction in this voltage required to operate the electronic shutter. The improved structure is provided with a simplified manufacturing process compared to conventional processes used by other CCD manufacturers. The invention improves upon the prior art, to alleviate the previously discussed difficulties, by providing between an n-type substrate and a p-type well, a uniform, deep n+ layer underneath the entire area of the device as shown in FIG. 2. Although this layer could be implanted early in the process, we have found it more convenient and easier to control by creating the deep n+layer via epitaxial growth. Additionally, the invention provides another n-type layer above the n+ layer.

It is also envisioned, that variations in the doping levels within the layer structures can be employed to achieve low voltage operation while maintaining internal gettering characteristics. This is provided by an image sensor structure that has a substrate of n-type conductivity, a first laterally uniform, deep n-layer on top of the substrate and underneath the entire area of the image sensor and a second laterally uniform n-layer on top the first laterally uniform n-layer that extends to the top surface of the device, and a laterally uniform, lightly doped p-layer formed in the second laterally uniform n-layer, such that the p-layer is located beneath image sensor and above the n-substrate and the first deep n-layer.

The above and other objects of the present invention will become more apparent when taken in conjunction with the following description and drawings wherein identical reference numerals have been used, where possible, to designate identical elements that are common to the figures.

ADVANTAGEOUS EFFECT OF THE INVENTION

The present invention has advantages over the prior art providing low voltage shuttering while retaining a simple fabrication process.

DETAILED DESCRIPTION OF THE INVENTION

Figure 1:
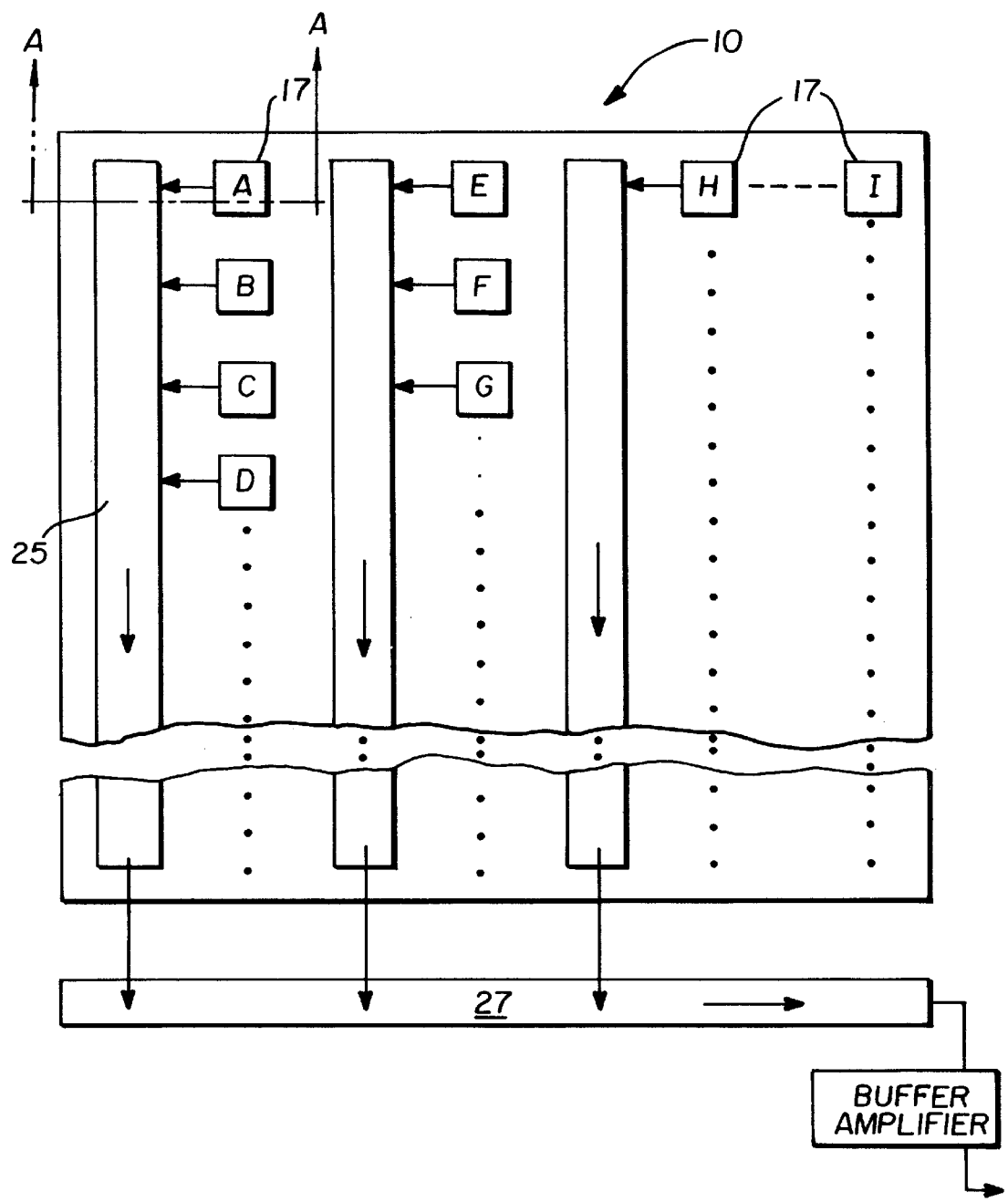
FIG. 1 is a top view of an interline CCD image sensor.

We have discovered that low voltage electronic shuttering can be provided for an image sensor while maintaining internal gettering characteristics. The preferred method of practicing the invention is by incorporating the elements into an interline device. While an interline device is preferred, use of the present invention within frame transfer devices is also envisioned. FIG. 1 schematically shows the general organization of an interline area image sensor having an array of photodiode sensor elements. Several of the sensor elements 17 which are shown in FIG. 1 are identified as A, B, C, D, E, F, G, H and I. The elements are arranged in columns and rows. Photocharge is integrated in each photodiode and, at a predetermined time, appropriate bias voltage pulse signals are applied to the transfer gate electrodes causing the charge to transfer from the photodiode to a vertical CCD shift register 25.

Figure 2:
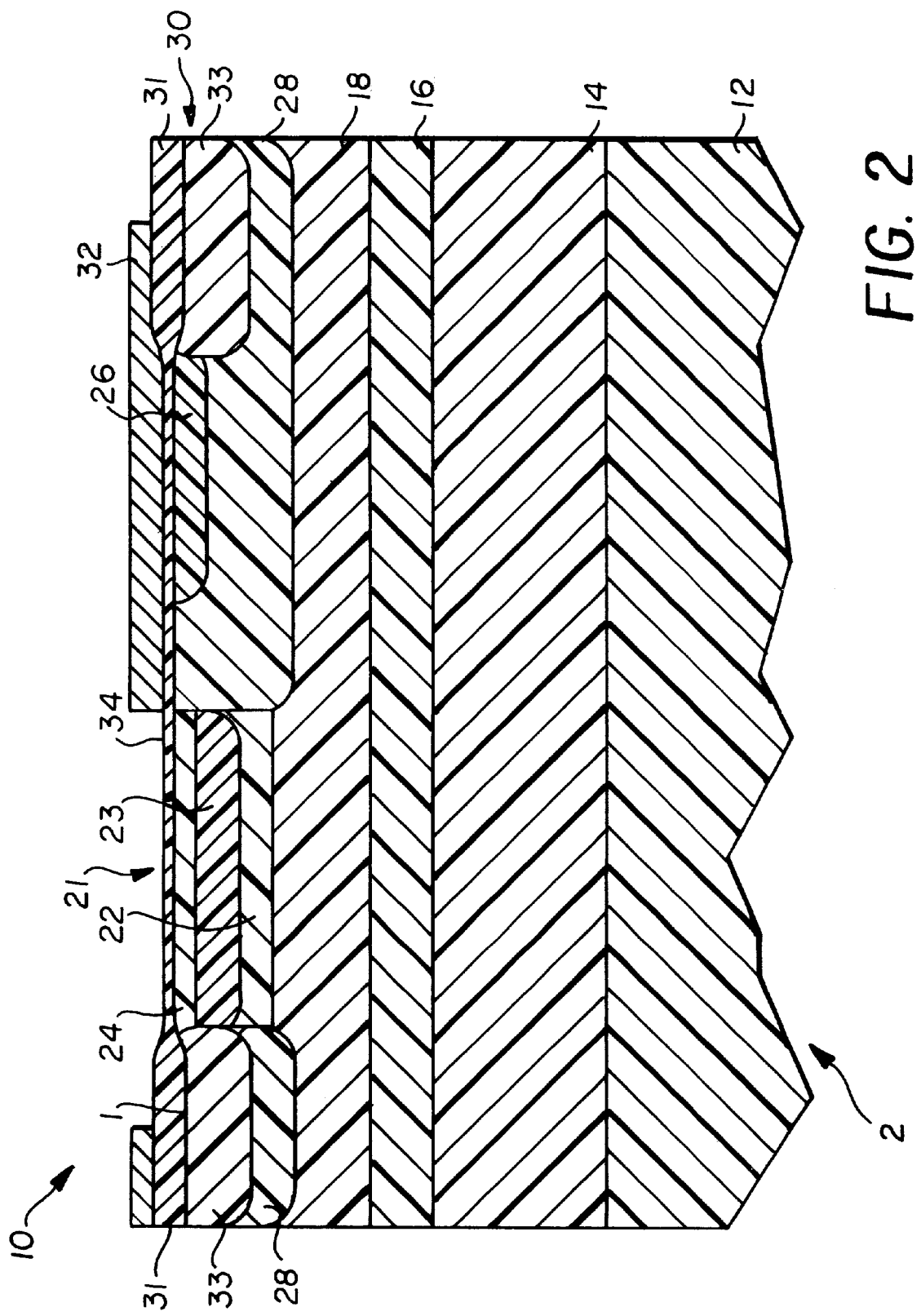
FIG. 2 is a cross section of a pixel illustrating the present invention.

Referring now to FIG. 2, which is a cross section of the interline sensor 10 shown in FIG. 1 taken along the line A—A, the preferred embodiment of the present invention illustrates the improved structure that provides low voltage electronic shuttering while maintaining gettering characteristics. Additionally, the pinned photodiode of sensor 10 eliminates image lag while the npn structure of the photodiode provides blooming protection through a vertical overflow drain. A substrate 12 with a top surface 1 and bottom surface 2, is fabricated to have an array of photodiodes, a plurality of vertical CCDs for transferring charge in said image sensor, including a plurality of transfer gate electrodes, each transfer gate electrode 32 being formed over an area of the substrate top surface 1 corresponding to a particular photodiode and extending over a substrate transfer region positioned adjacent to a corresponding photodiode and responsive to a voltage signal for transferring charge from its corresponding photodiode to its particular CCD cell.

The substrate 12 is created from n-type material. Above the n-substrate 12 is a laterally uniform, highly doped n-+layer 14, that can be created either as an epitaxial layer or as an implant. Above the layer 14 is a more lightly doped n-type layer 16, that is also laterally uniform and again can be created as either an epitaxial layer or as an implant. On top of layer 14, light p-well 18 is formed in a laterally uniform manner, such that it forms a p-n junction spaced from the top surface 1 of the substrate 12 by a predetermined amount.

This structure provides a vertical antiblooming overflow drain having a local potential minima which is confined to be deep in the uniform p-well to maintain high quantum efficiency, and reduces the voltage demands of off-chip circuitry required to operate the image sensor by virtue of layer 14.

The photodiode 21 and pinning layer 24 as well the elements required to create a charge-transfer device are then placed within p-well 18 as explained below. A laterally uniform, lightly doped n-well 22 is formed near the top 1 of the substrate 12 on top of the uniform p-well 18. A plurality of localized n-layers 23 is formed in the n-well 22 in an array corresponding to the array of the photodiodes 21 and a separate localized p-layer formed at the surface of each n-layer to create a pinning layer 24 to form a pinning photodiode for collecting photocharge and eliminating image lag. The pinning layer 24 being connected to a predetermined potential via the channel stop 33.

A plurality of p-stripes formed in the uniform lightly doped n-well 22 to form a heavily doped p well 28 that it is adjacent the photodiodes 21 and having a portion formed under each area to be the CCD and a thermally diffused portion providing sufficient doping beneath a transfer gate electrode, but not extending to an adjacent photodiode 21 to enable charge collected in the photodiode 21 to be transferred to its CCD leaving the photodiode 21 completely depleted when the desired voltage level is applied to the transfer gate electrode 32.

One p-stripe for each CCD is formed under the polysilicon gate electrode 32. It extends upward to the gate oxide, and extends laterally toward the corresponding photodiode 21. The heavy p-well becomes the body for construction of the CCD shift registers. The buried-channel CCD region 26 is an n-type region constructed within the heavy p-well 28, and the CCD gate electrode 32 is clocked with voltages with reference to the heavy p-well 28.

The substrate 12 can be heated to thermally drive both wells 28 and 22 into substrate 12 or alternatively suitable implants can be used. As a result of the careful choice of implant parameters and thermal processing, the narrow, laterally uniform, lightly doped p-well 18 is provided typically with a junction depth several micrometers below the substrate top surface 1. Thereafter, p- and n-layers (respectively 24 and 23) are formed in n-well 22 for a fully depletable photodiode. The above arrangement provides pinned photodiode with a vertical-overflow drain structure. A thermal oxide 34 is formed on the top surface 1 of substrate 12. However, some other insulating layers may be used instead as would be understood by those skilled in the art. The pinned photodiode has two p-n junctions, one formed by the uniform layer that is the n-well 22 with uniform p-layer that is p-well 18, and the second formed by localized n-layer that forms photodiode 21 with the localized layer that forms the p-type pinning layer 24. In response to light, charge is collected in the cathode of the photodiode.

The photodiode isolation in the vertical direction is accomplished by appropriate channel stops 30 comprised of a thick oxide 31 with p-type implant 33 beneath. Other isolation technology could also be used. Such isolation is part of the standard CCD process. The p-layers 24 and 33 are physically contiguous and are electrically connected to ground potential.

Preferably, the n-type substrate 12 is provided with a doping level on the order of $10^{14} cm^{-3}$ with a first epitaxial layer 14 having a doping level on the order of $10^{16} cm^{-3}$, a second epitaxial layer having a doping level on the order of $10^{14} cm^{-3}$, and a p-well having a doping level on the order of $10^{15} cm^{-3}$. This preferred configuration, or the like, has been found to be effective in maintaining a simple process for internal gettering. Also, whereas the first and second epitaxial layers (14 and 16, respectively) are uniform underneath the entire area of sensor 10, it should be noted that the present invention can be practiced using wells in place of the double epitaxial layers shown in FIG. 2.

Figure 3:
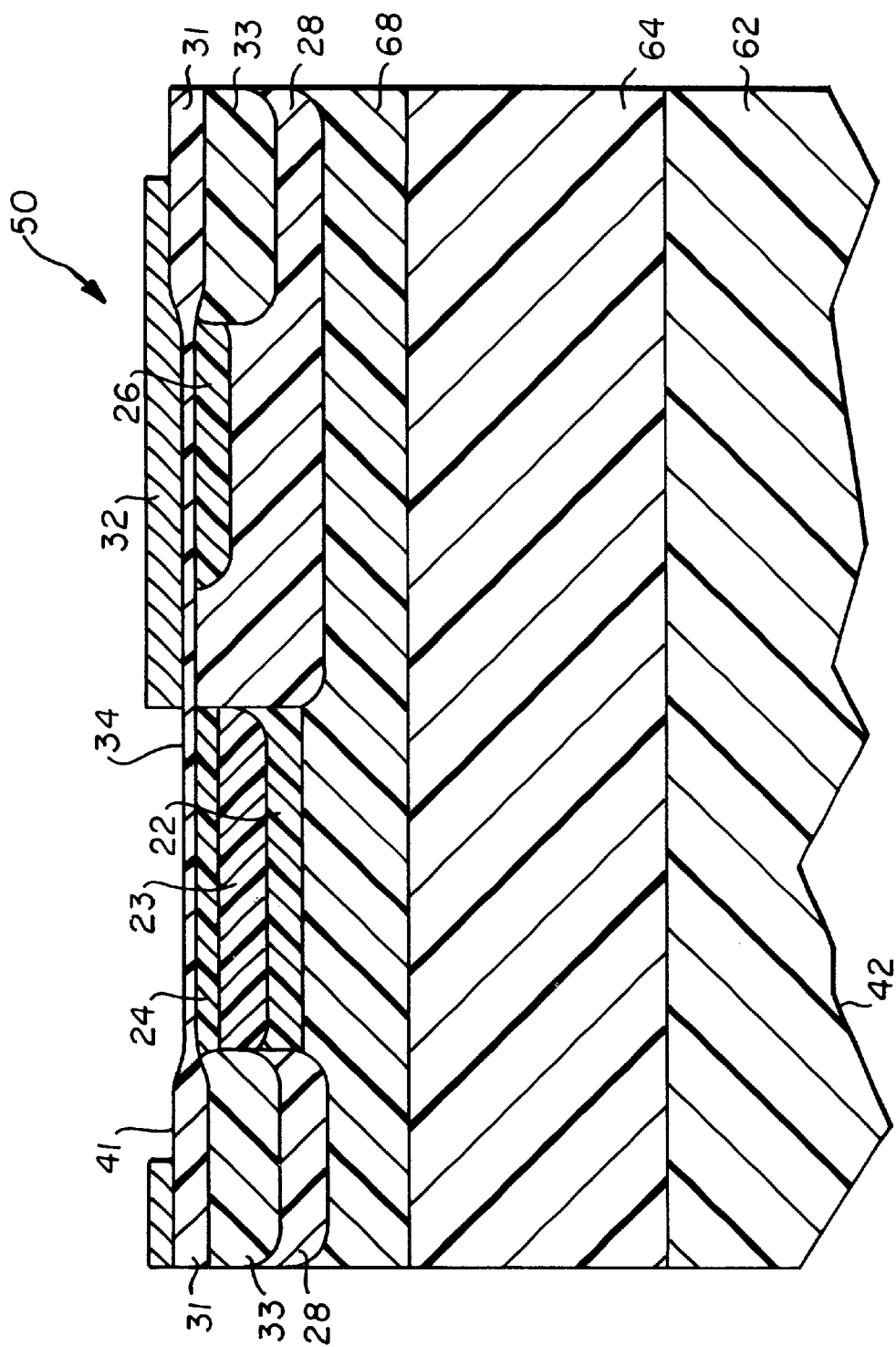
FIG. 3 is a view of a prior art CCD sensor without improved voltage characteristics for electronic shutter operation.

FIG. 3 shows prior art CCD image sensor 50. Sensor 50 comprises n-type substrate 62 having a uniform n-type epi layer 64. Substrate 62 defines top and bottom surfaces 41 and 42, respectively. Uniform lightly doped p-well 68 is then implanted into the top portion 41 of the n-epi 64. The remaining portions of device 50 are similar to those shown in FIG. 2. The structure of the type shown in FIG. 3 will typically have an n-type substrate doped to around $10^{14} cm^{-3}$. The epitaxial layer 64 is typically provided with n-type doping material at around $10^{14} cm^{-3}$. This structure, while providing a vertical overflow drain function, lacks the desirable low voltage electronic shutter operation achieved by the structure of the present invention as illustrated in FIG. 2.

Figure 4:
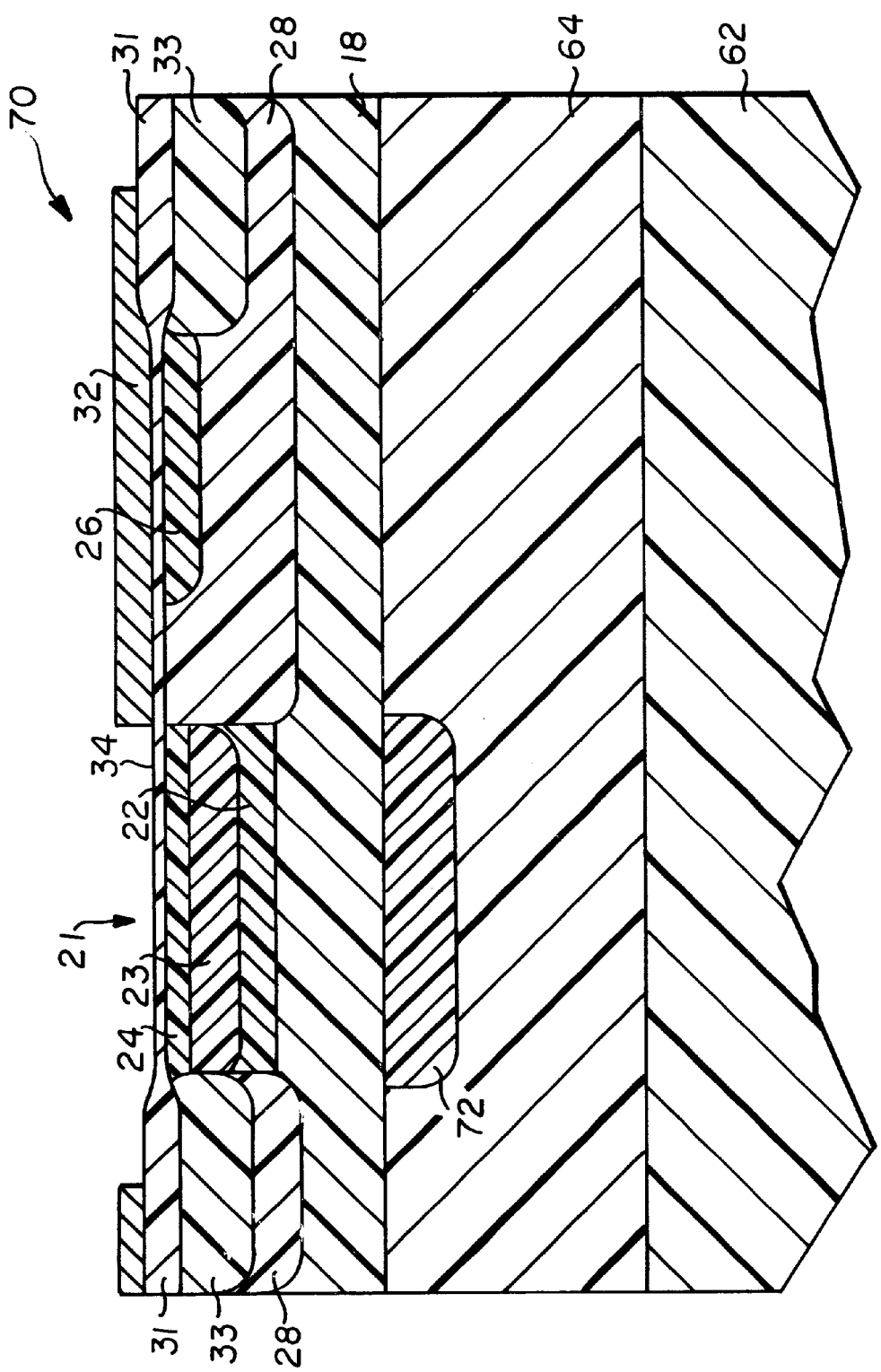
FIG. 4 is a view of a prior art CCD sensor with an n+ region formed directly underneath the photodetectors.

FIG. 4 shows another prior art interline CCD image sensor 70 that is similar to the prior art with an additional n-region 72 which is a region of higher doping concentration (relative to the n-type epi layer 64) directly beneath individual photodiodes 21 of sensor 70. This structure allows the overflow barrier to be pulled down more easily with less voltage on the substrate. However, manufacturing the structure requires a difficult process in that each n-region 72 is confined only directly below each individual detector. This would typically require high energy implantation or reduced p-well depth. The present invention provides a uniform layer that can be implanted early in the process or via epitaxial growth.

Figure 5:
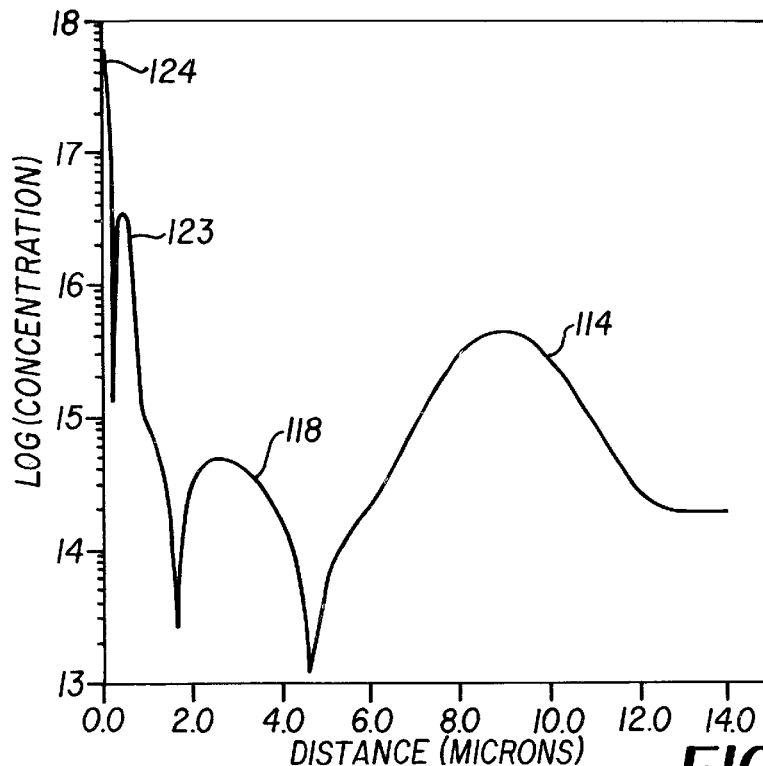
FIG. 5 shows the photodiode's doping profile of the invention of FIG. 2.
Figure 6:
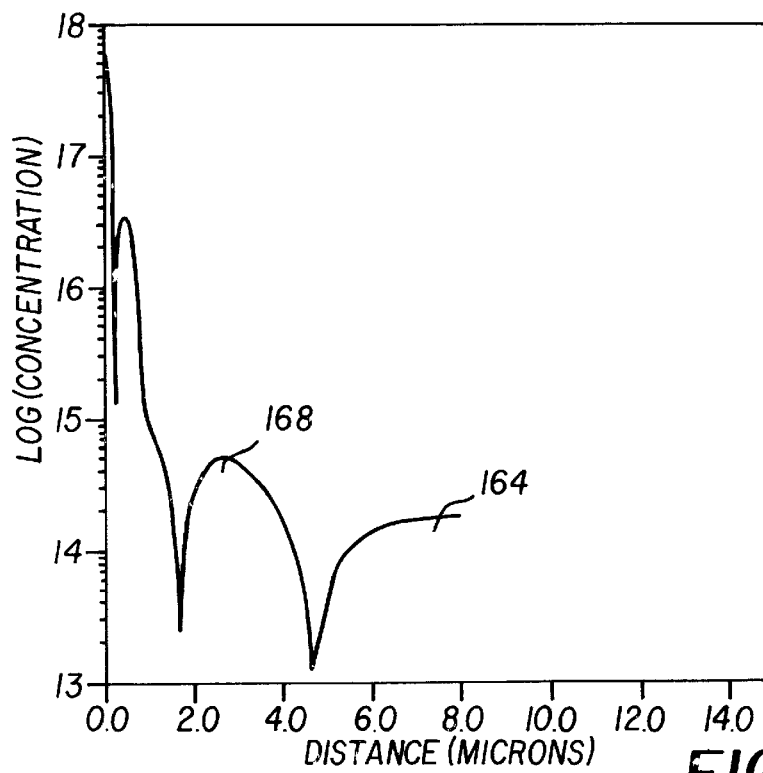
FIG. 6 shows the photodiode's doping profile of the prior art device of FIG. 3.
Figure 7:
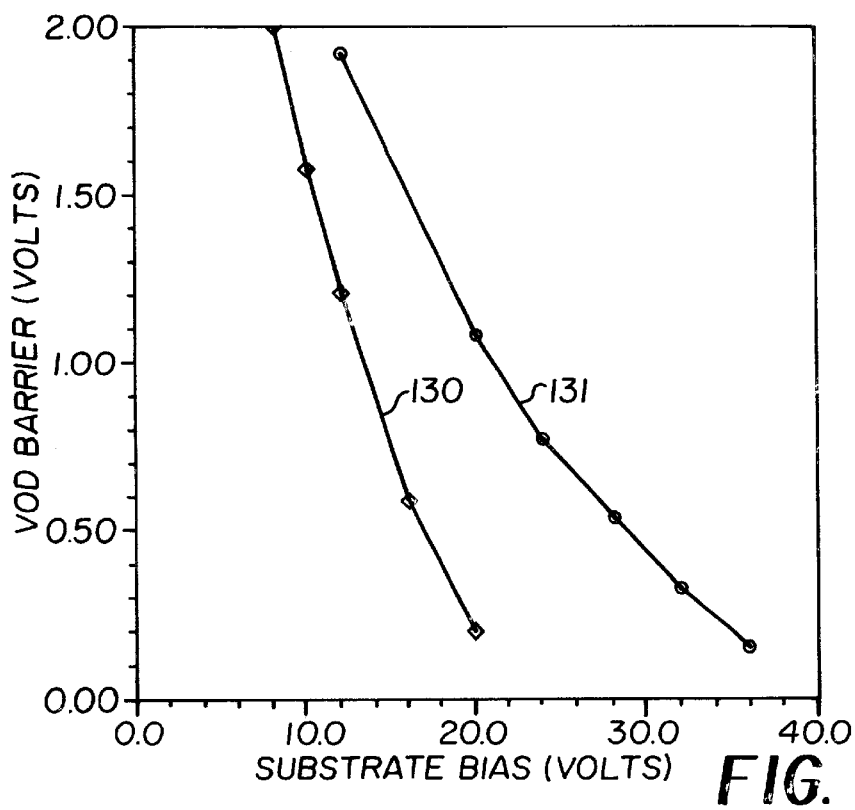
FIG. 7 shows the photodiode's barrier to overflow versus substrate voltage for FIG. 2 and prior art FIG. 3.

FIGS. 5 and 6 show the doping profiles (down the center of the photodiode) and FIG. 7 shows the barrier-to-overflow versus substrate voltage for the two structures, indicated as 130 and 131 for FIGS. 2 and 3, respectively. The barrier-to-overflow is defined as the maximum potential in the n-region 23 of the diode (FIG. 2) minus the minimum potential in the light p-well region 18. In FIG. 5 the concentration of the pinning layer is indicated as 124, that of the n photodiode region is 123, of the p-well as 118 as the n type epi layer as 114. The magnitude of the barrier-to-overflow is related to the photodiode's charge capacity, which drops as the barrierto-to-overflow approaches a few multiples of kT/q, where k is Boltzmann's constant, T is the absolute temperature and q is the charge of an electron. Therefore, for a low voltage shutter, it is desirable to have this parameter approach zero at a low shutter voltage, yet have it be large enough at lower substrate voltage levels to maintain adequate charge capacity, i.e., a curve with a steep slope is desirable. All the charge in the photodiode will be lost to the substrate as this barrier approaches a few kT/q. Note that the new structure of the present invention reduces the substrate voltage required for shuttering (complete reset) by about a factor of 2. This can be seen by comparing the prior art p-well 68 concentration, indicated as 168, and n-region concentration indicated as 164, with those of FIG. 5. Here, the shape of the curves in FIG. 7 depends on the doping profiles of the photodetector. However, for a given doping profile for the device structure shown in FIG. 2, increasing the doping concentration of the n+ first epitaxial layer 14 will increase the slope of the barrier versus substrate voltage curve, and making this layer deeper, will move the curve to the right. This preferred doping level is shown as 114 in FIG. 5. Therefore, choosing the appropriate n+ first epitaxial layer 14 doping, thickness and depth can easily be tailored for a given, existing process using readily available computer-aided design software.

Figure 8:
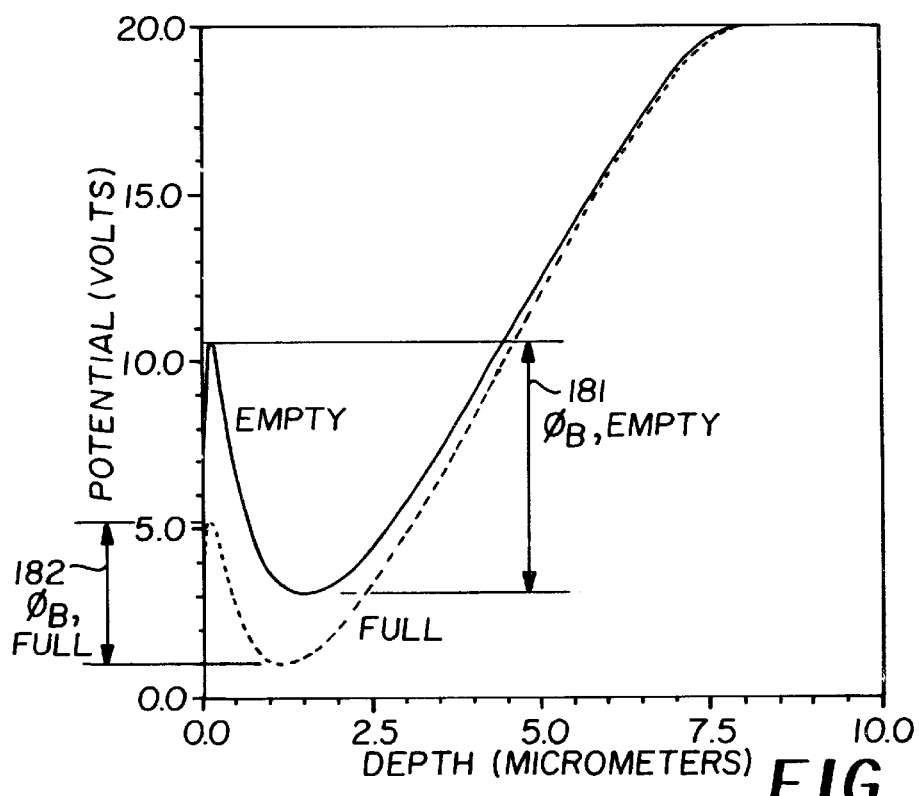
FIG. 8 shows the VCCD's potential profile versus depth for FIG. 2.

An important concern with this new structure is that an adequate barrier be maintained between the CCD and substrate so that charge is not inadvertently lost from the CCD shift registers during the shutter pulse. FIG. 8 shows the potential profile versus well filling down through the center of the CCD shift register at a substrate bias of Vsub=20V for the new structure. FIG. 8 shows that an adequate charge capacity is maintained in the CCD and that charge is not lost to the substrate under these conditions since the barrier to the substrate, ØB indicated as 182, is over 4V at full well. This follows from the expression for current into the substrate as given by the expression $(I=I_o e^{-ØB/nkT})$; where n is the non-ideality factor. The advantage of this structure over the prior art is that a reduced electronic shutter voltage can be obtained with a simple process. The difficulties encountered in the prior art device of FIG. 4, associated with feature registration (i.e., alignment of the deep n+ region) and high energy implantation are avoided.

While the best mode known to the inventors for carrying out the invention has been described above, various options are envisioned by the inventors as other preferred embodiments. Among these options is the preferred embodiment of growing a heavily doped epitaxial layer on top the substrate and then changing to a more lightly doped epitaxial layer. An alternative, is to grow a lightly doped epitaxial layer, stop the growth and create an implant, then continue the growth of the lightly doped epitaxial layer, or before implant create a diffusion and then continue the growth. Still another alternative, is to grow the epitaxial layer, and create a sufficiently high energy implant to produce a buried N+ layer.

The invention has been described with reference to a preferred embodiment. However, it will be appreciated that variations and modifications can be effected by a person of ordinary skill in the art without departing from the scope of the invention.

Figure 9:
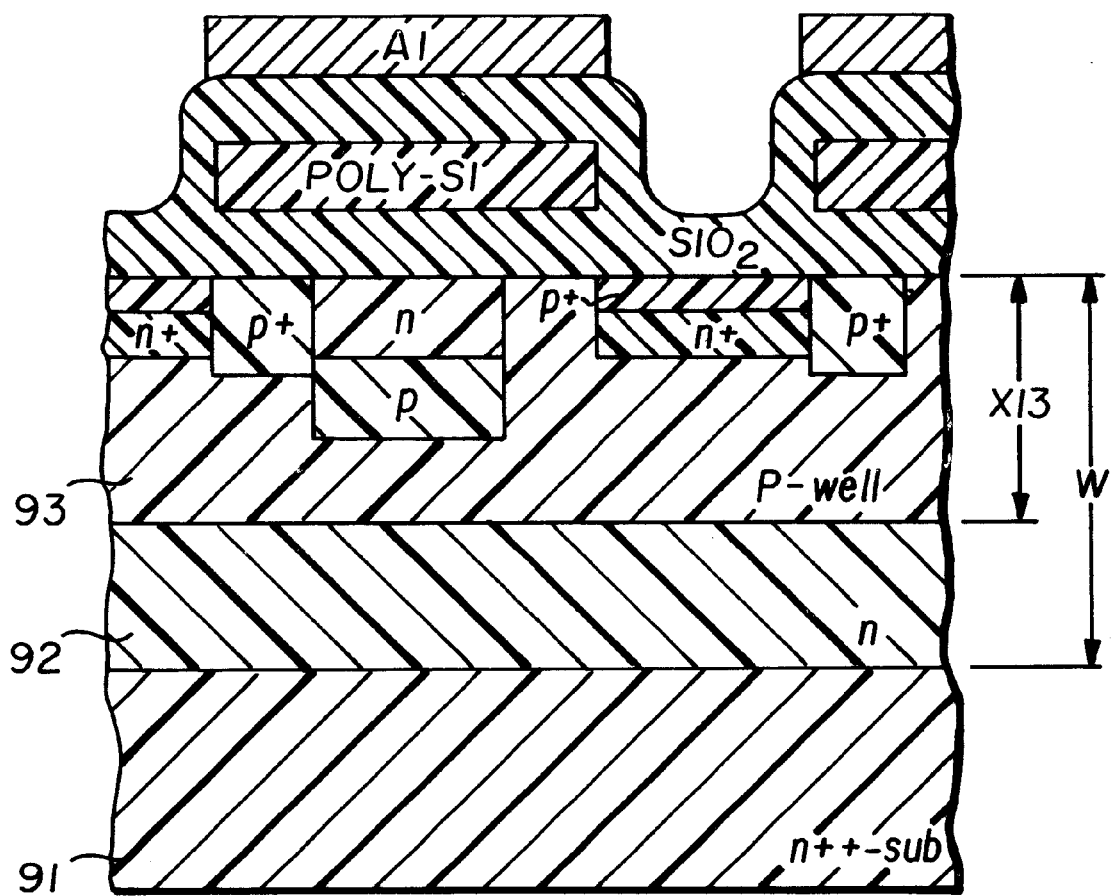
FIG. 9 shows another prior art device having uniform layers but with heavily doped substrate.

Parts list:
1 Top surface of the silicon substrate
2 Bottom surface of silicon substrate
10 Image sensor of the present invention
12 n-type substrate
14 n$^+$ epitaxial layer
16 n$^-$ epitaxial layer
17 Sensor elements of FIG. 1
18 P-well
21 n-type photodiode
22 light n-well
23 localized n-layers
24 p-type Pinning layer
25 Vertical CCD (VCCD) of FIG. 1
26 n-type Buried channel
27 Horizontal CCD (HCCD) of FIG. 1
28 Heavy p-well
30 Channel stops
31 Thick oxide
32 Gate electrode
33 p+ channel stop implant
34 Oxide
41 Top of device of FIG. 3
42 Bottom of device of FIG. 3
50 Device of FIG. 3
62 Substrate for FIG. 3 and 4.
64 N type epitaxial layer of FIG. 3 and 4
68 P well of FIG. 3
70 Device of FIG. 4
72 n+ layer of FIG. 4
90 Device illustrated in FIG. 9
91 n++ substrate of device of FIG. 9
92 n layer of device of FIG. 9
93 p-well of device of FIG. 9
114 doping profile of n-type layer of FIG. 5
118 doping profile of p-well of FIG. 5
123 doping profile of photodiode region of FIG. 5.
124 doping profile of pinning layer of FIG. 5.
130 doping profile of center of photodiode of FIG. 2.
131 doping profile of center of photodiode of FIG. 3.
168 prior art p-well concentration
182 substrate barrier in FIG. 8

What is claimed is:

1. An interline area image sensor which provides low voltage electronic shuttering that eliminates image lag while providing blooming protection and having a substrate having a top and a bottom surface, the substrate having an array of photodiodes at the top surface extending downward several microns, a plurality of vertical charge coupled devices (CCDs) for transferring charge from the photodiodes in said image sensor, including a plurality of transfer gate electrodes, each transfer gate electrode being formed over the substrate top surface and corresponding to a particular photodiode and extending over a transfer region positioned adjacent to a corresponding photodiode and responsive to a voltage signal for transferring charge from its corresponding photodiode to its particular CCD pixel, comprising:

a) the substrate having an n-conductive portion, a laterally uniform, lightly doped buried p-layer formed in the n-conductive portion and spaced from the top surface of the substrate, a laterally uniform, lightly doped n-layer formed in the substrate on top of the buried p-layer, a plurality of localized n-layers formed in the uniform n-layer in an array corresponding to the array of the photodiodes and a separate localized p-layer formed in each localized n-layer to complete a pinned photodiode for collecting photocharge, and such p-layers being connected to a reference potential, so as to provide a vertical antiblooming overflow drain having a local potential minima which is confined to be deep in the uniform p-well to maintain high quantum efficiency;

b) a plurality of p-stripes formed in the uniform lightly doped n-layer such that the p-stripes are adjacent to the photodiodes and having a portion formed under each CCD and another portion providing sufficient doping beneath a transfer gate electrode, but not extending into the adjacent photodiode such that when the voltage signal is applied to the transfer gate electrode, signal charge collected in the photodiode is transferred to its CCD depleting the photodiode, said p-stripes are also connected to the reference potential;

c) a first laterally uniform, deep n-layer underneath the entire area of the image sensor located beneath the uniform p-well and above the n-substrate and a second laterally uniform n-layer on top of the first laterally uniform n-layer; and wherein the first laterally uniform, deep n-layer is more heavily doped than the second laterally uniform n-layer.

2. The invention of claim 1 wherein said deep n-layer of claim 1 being created by the growth of a relatively heavily doped epitaxial layer on said substrate.

3. The invention of claim 1 wherein the n-type substrate is doped less than the first laterally uniform, deep n-layer.

4. The invention of claim 1 wherein the first laterally uniform, deep n-layer is formed with a higher doping level than the second laterally uniform n-layer and the n-type substrate.

5. An image sensor structure which provides low voltage electronic shuttering that is conducive to internal gettering comprising:

a substrate of n-type conductivity having a top and a bottom surface;

a first laterally uniform, deep n-layer on top of the substrate and underneath the entire area of the image sensor and a second laterally uniform n-layer on top of the first laterally uniform n-layer; and a laterally uniform, lightly doped p-layer formed in the second laterally uniform n-layer, such that the p-layer is located beneath the image sensor and above the n-substrate and the first deep n-layer and;

wherein the first laterally uniform, deep n-layer is more heavily doped than the second laterally uniform n-layer.

6. The invention of claim 5 wherein the n-type substrate is doped less than the first laterally uniform, deep n-layer.

7. The invention of claim 5 wherein the image sensor comprises one of the following: an interline sensor; a frame-transfer; or a linear sensor.

8. The invention of claim 5 wherein the first laterally uniform, deep n-layer is formed with a higher doping level than the second laterally uniform n-layer and the n-type substrate.

9. The invention of claim 5 wherein the image sensor further comprises at least one photodetecting element located within the image sensing area.

10. The invention of claim 5 wherein the conductivity type of the various layers is reversed.

* * * * *